(12) United States Patent
Wilson et al.

(10) Patent No.: US 10,424,027 B1
(45) Date of Patent: Sep. 24, 2019

(54) FIBER OPTIC MAGNETIC INDUCTION (B-FIELD) SENSORS

(71) Applicant: HALLIBURTON ENERGY SERVICES, INC., Houston, TX (US)

(72) Inventors: Glenn Andrew Wilson, Houston, TX (US); Yan Wah Michael Chia, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 15/768,805

(22) PCT Filed: Nov. 17, 2015

(86) PCT No.: PCT/US2015/061038
§ 371 (c)(1),
(2) Date: Apr. 16, 2018

(87) PCT Pub. No.: WO2017/086929
PCT Pub. Date: May 26, 2017

(51) Int. Cl.
*G06Q 50/02* (2012.01)
*G06Q 10/06* (2012.01)
*E21B 41/00* (2006.01)
*E21B 49/00* (2006.01)
(Continued)

(52) U.S. Cl.
CPC ......... *G06Q 50/02* (2013.01); *E21B 41/0092* (2013.01); *E21B 43/14* (2013.01); *E21B 47/06* (2013.01); *E21B 49/00* (2013.01); *G06Q 10/06314* (2013.01)

(58) Field of Classification Search
CPC .............. G06Q 50/02; G06Q 10/06314; E21B 41/0092; E21B 43/14; E21B 49/00

USPC ....... 324/314, 323, 324–368, 221, 637, 639, 324/676, 76.11–76.77, 250, 710, 500, 324/754.06, 754.31
See application file for complete search history.

(56) References Cited

U.S. PATENT DOCUMENTS

| | | | | |
|---|---|---|---|---|
| 6,307,665 B1 * | 10/2001 | Kim | ...................... | G02F 1/0316 359/285 |
| 2014/0175271 A1 * | 6/2014 | Samson | ................ | E21B 47/123 250/264 |

OTHER PUBLICATIONS

F.C. Frischknecht, 1988, Electromagnetic Physical Scale Modeling, in M.N. Nabighian, Electromagnetic Methods in Applied Geophysics, vol. 1, Society of Exploration Geophysicists, 365-441.
(Continued)

*Primary Examiner* — Melissa J Koval
*Assistant Examiner* — Trung Nguyen
(74) *Attorney, Agent, or Firm* — Locke Lord LLP

(57) ABSTRACT

A sensing system includes a magnetic induction sensor. The magnetic induction sensor includes an induction coil for measuring a magnetic induction and for providing an output electrical signal representative of at least one component of the magnetic induction. The magnetic induction sensor further includes an electro-optical transducer for converting the electrical signal into an optical signal. The magnetic induction sensor also includes at least one impedance matching circuit electrically connected with an output of the induction coil and electrically connected with an input of the electro-optical transducer. The sensing system further includes at least one fiber optic sensing cable coupled to the magnetic induction sensor that optically communicates optical signals from the magnetic induction sensor.

15 Claims, 5 Drawing Sheets

(51) Int. Cl.
*E21B 43/14* (2006.01)
*E21B 47/06* (2012.01)

(56) References Cited

OTHER PUBLICATIONS

J. Macnae, 2012, Design and Testing of ARMIT Magnetic Field Sensors for EM Systems; Presented at 22nd ASEG Conference and Exhibition.
J. Macnae and T. Kratzer, 2013, Joint Sensing of B and dB/dt Responses: Presented at 23rd ASEG Conference and Exhibition.
R.S. Smith and A.P. Annan, 1998, The use of B-Field Measurements in an Airborne Time-Domain Systems: Part I. Benefits of B-Field versus dB/dt Data: Exploration Geophysics, 29, 24-29.
R.S. Smith and A.P. Annan, 2000, Using an Induction Coil Sensor to Indirectly Measure the B-Field Response in the Bandwidth of the Transient Electromagnetic Method: Geophysics, 65 (5), 1489-1494.
P. Wolfgram and S. Thomson, 1998, The Use of B-Field Measurements in an Airborne Time-Domain System—Part II: Examples in Conductive Regimes: Exploration Geophysics, 29, 225-229.

\* cited by examiner

FIBER OPTIC MAGNETIC INDUCTION (B-FIELD) SENSORS

TECHNICAL FIELD OF THE INVENTION

The embodiments disclosed herein relate to sensing systems and, more particularly, to a system and method for measuring magnetic induction in the earth by use of optical-fiber based magnetic induction sensors.

BACKGROUND OF THE INVENTION

Oil field operators drill boreholes into subsurface reservoirs to recover oil and other hydrocarbons. If the reservoir has been partially produced or if the oil is particularly viscous, the oil field operators will often inject water or other fluids into the reservoir via secondary wells to encourage the oil to move to the primary ("production") wells and thence to the surface.

Information about the geologic formations and about reservoir characteristics promotes efficient development and management of hydrocarbon resources. Reservoir characteristics include, among others, resistivity of the geologic formation containing hydrocarbons. The resistivity of geologic formations is generally related to porosity, permeability, and fluid content of the reservoir. Because hydrocarbons are generally electrically insulating and most formation water is electrically conductive, formation resistivity (or conductivity) measurements are a valuable tool in determining the hydrocarbon content of reservoirs. Moreover, formation resistivity measurements may be used to monitor changes in reservoir hydrocarbon content during production of hydrocarbons.

Generally, formation resistivity is sensitive to fluid saturation. The ability to remotely determine and monitor formation resistivity is of direct relevance to reservoir monitoring, particularly for enhanced recovery with water-flooding and/or carbon dioxide injection. Accordingly, there is continued interest in the development of permanent sensing systems.

BRIEF DESCRIPTION OF THE SEVERAL VIEWS OF THE DRAWING

For a more complete understanding of the disclosed embodiments, and for further advantages thereof, reference is now made to the following description taken in conjunction with the accompanying drawings in which.

DETAILED DESCRIPTION OF THE DISCLOSED EMBODIMENTS

The following discussion is presented to enable a person skilled in the art to make and use the invention. Various modifications will be readily apparent to those skilled in the art, and the general principles described herein may be applied to embodiments and applications other than those detailed below without departing from the spirit and scope of the disclosed embodiments as defined herein. The disclosed embodiments are not intended to be limited to the particular embodiments shown, but is to be accorded the widest scope consistent with the principles and features disclosed herein.

The following disclosed embodiments present a fiber optic-based technology suitable for use in permanent downhole EM reservoir monitoring environment with active and/or natural sources. One illustrative sensing system has an array of magnetic induction sensors positioned in an annular space around a well casing, the sensors being coupled to a surface interface via a fiber optic sensing cable. Each magnetic induction (B-field magnetic field) sensor is a device that produces signals that are a function of external magnetic field. Illustrative sensors provide signals that are directly or inversely proportional to magnetic induction (i.e., B) in the earth, rather than induced electromotive force in the earth (i.e., dB/dt). The illustrative magnetic induction sensors have no active power consumption components and satisfy the requirements of various oilfield-related electrical standards (e.g., the Intelligent Well Interface Standard, IWIS). This can provide significant benefit in offshore well environments where available power from a subsea power module is very limited. Furthermore, as set forth below, the disclosed embodiments of magnetic induction sensors are capable of sensing lower minimum magnetic induction relative to the conventional dB/dt magnetic induction sensors. In at least some embodiments, the disclosed systems and methods can be applied to permanently monitor fluid movement within reservoirs including, but not limited to, water-flooding, steam injection, and gas flooding. Gas-flooding, such as using carbon-dioxide or methane, is similar to water-flooding but entails injecting into a gas instead of water to displace hydrocarbons to a production well.

Figure 1:
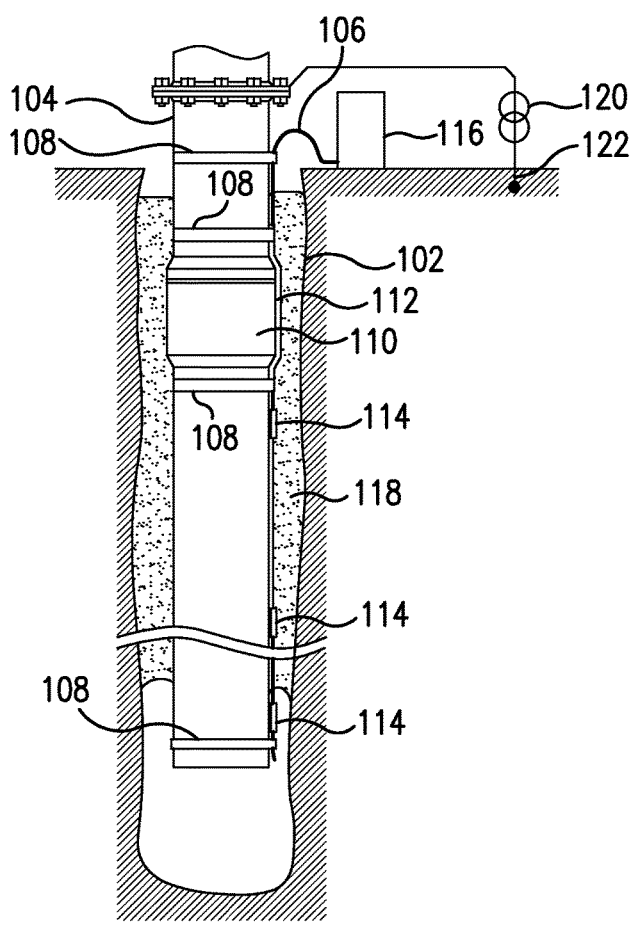
FIG. 1 shows an illustrative environment for permanent electromagnetic (EM) reservoir monitoring according to the disclosed embodiments.

Turning now to the drawings, FIG. 1 shows an illustrative permanent downhole EM monitoring environment. A borehole 102 contains a casing string 104 with a fiber optic sensing cable 106 secured to it by bands 108. Casing 104 is a tubular pipe, usually made of steel that preserves the integrity of the borehole wall and borehole. Where the cable 106 passes over a casing joint 110, it may be protected from damage by a cable protector 112. A plurality of magnetic induction sensors 114 are integrated into the cable 106 to obtain B-field measurements and communicate those measurements to a surface interface 116 via fiber optic sensing cable 106. In various embodiments, the surface interface 116 interrogates those measurements through at least one method of multiplexing.

The remaining annular space may be filled with cement 118 to secure the casing 104 in place and prevent fluid flows in the annular space. Fluid enters the uncemented portion of the well (or alternatively, fluid may enter through perforated portions of the well casing) and reaches the surface through the interior of the casing. Note that this well configuration is merely illustrative and not limiting on the scope of the disclosure. Many production wells are provided with multiple production zones that can be individually controlled. Similarly, many injection wells are provided with multiple injection zones that can be individually controlled.

Surface interface 116 includes an optical port for coupling the sensing optical fiber(s) in cable 106 to a light source and a detector. The light source transmits pulses of light along the fiber optic cable, including any magnetic induction sensors 114. The magnetic induction sensors 114 modify the light pulses to provide measurements of one, two, or three components of the magnetic induction. In all embodiments, the magnetic induction sensors 114 generate at least one magnetic induction component measurement. The modifications may affect amplitude, phase, or frequency content of the light pulses, enabling the detector to responsively produce an electrical output signal indicative of the sensor measurements using one or more known multiplexing techniques. Some systems may employ multiple fibers, in which case an additional light source and detector can be employed for each fiber, or the existing source and detector may be switched periodically between the fibers. Some system embodiments may alternatively employ continuous wave (CW) light rather than light pulses.

FIG. 1 further shows a power source 120 coupled between the casing 104 and a remote earth electrode 122. Because the casing 104 is an electrically conductive material (e.g., steel), it acts as a source electrode for current flow into the formations surrounding the borehole 102. The magnitude and distribution of the current flow will vary in accordance with the source voltage and the formation's resistivity profile. The magnetic induction measurements by sensors 114 will thus be representative of the resistivity profile. This resistivity profile in turn is indicative of the fluids in the formation pores, enabling the flood front to be located and tracked over time. In other embodiments, the casing 104 may comprise insulating materials (e.g., fiber glass).

The surface interface 116 may be coupled to a computer that acts as a data acquisition system and possibly as a data processing system that analyzes the measurements to derive subsurface parameters related to the B-field. In some contemplated system embodiments, the computer may further control production parameters to reduce risk of breakthrough or to otherwise optimize production based on the information derived from the measurements. Production parameters may include the flow rate/pressure permitted from selected production zones, flow rate/pressure in selected injection zones, and the composition of the injection fluid, each of which can be controlled via computer controlled valves and pumps.

Generally, any such computer would be equipped with a user interface that enables a user to interact with the software via input devices such as keyboards, pointer devices, and touchscreens, and via output devices such as printers, monitors, and touchscreens. The software can reside in computer memory and on non-transient information storage media. The computer may be implemented in different forms including, e.g., an embedded computer permanently installed as part of the surface interface 116, a portable computer that is plugged into the surface interface 116 as desired to collect data, a remote desktop computer coupled to the surface interface 116 via a wireless link and/or a wired computer network, a mobile phone/PDA, or indeed any electronic device having a programmable processor and an interface for I/O.

Figure 2A:
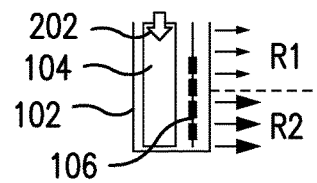
FIGS. 2A-2E show various illustrative injected-current system configurations according to the disclosed embodiments.

FIG. 2A is a schematic representation of the system configuration in FIG. 1. It shows a borehole 102 having a casing 104 and a fiber optic cable 106 (with an integrated sensor array) in the annular space. An injected current 202 flows along casing 104 and disperses into the surrounding formations as indicated by the arrows. Two formations are shown, labeled with their respective resistivities R1 and R2. The heavier arrows in the lower formation represent a larger current flow, indicating that resistivity R2 is lower than resistivity R1. Due to divergence pattern of the currents away from the casing, depth of investigation is typically around 5-15 feet.

Figure 2B:
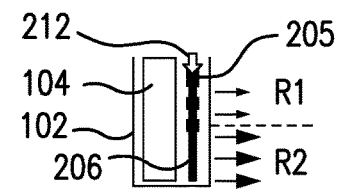

FIG. 2B shows an alternative system configuration, in which the fiber optic cable 106 is replaced by an alternative fiber optic cable 206 having a conductor or a conductive layer to transport an injected current 212 along the cable. The conductor may be a protective metal tube within which the fiber optic cable is placed. Alternatively, the conductor may be a wire (e.g., a strength member) embedded in the fiber optic cable. As another alternative, a metal coating may be manufactured on the cable to serve as the current carrier. Parts of the cable may be covered with an insulator 205 to focus the current dispersal in areas of interest. Because conductive layers can significantly attenuate certain types of electromagnetic (EM) fields, the sensors are designed to be operable despite the presence of the conductive layer, e.g., magnetic field sensors, and/or apertures are formed in the conductive layer to permit the EM fields to reach the sensors.

Figure 2C:
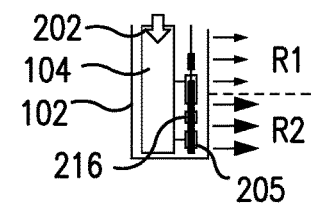

FIG. 2C shows another alternative system configuration. A conductor or conductive layer of fiber optic cable 206 is electrically coupled to casing 104 to share the same electrical potential and contribute to the dispersal of current into the formation. Parts of the cable 206 and/or casing 104 may be covered with an insulator 205 to focus the current dispersal in areas of interest.

Figure 2D:
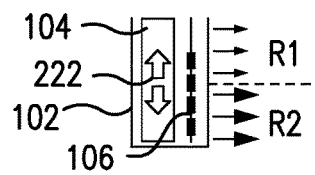

FIG. 2D shows yet another alternative system configuration. Rather than providing an injected current 202 from the surface as in FIG. 2A, the configuration of FIG. 2D provides an injected current 222 from an intermediate point along the casing 104. Such a current may be generated with an insulated electrical cable passing through the interior of casing 104 from a power source 120 (FIG. 1) to a tool that makes electrical contact at the intermediate point, e.g., via extendible arms. (An alternative approach employs a toroid around casing 104 at the intermediate point to induce current flow along the casing. The toroid provides an electric dipole radiation pattern rather than the illustrated monopole radiation pattern.)

Figure 2E:
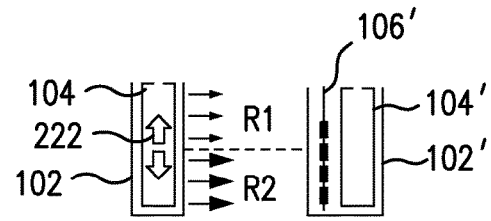

In general, in another aspect, the systems and methods disclosed herein can be deployed along the casing of a single wellbore, or along the casings of multiple wellbores. FIG. 2E shows still another alternative system configuration having a first borehole 102 and second borehole 102'. Casing 104 in the first borehole 102 carries an injected current from the surface or an intermediate point and disperses it into the surrounding formations. The second borehole 102' has a casing 104' for producing hydrocarbons and further includes a fiber optic cable 106' with an integrated magnetic induction sensor array in the annular space around casing 104'. The magnetic induction sensors provide measurements of the B-field resulting from the currents dispersed in the formations.

Figure 3A:
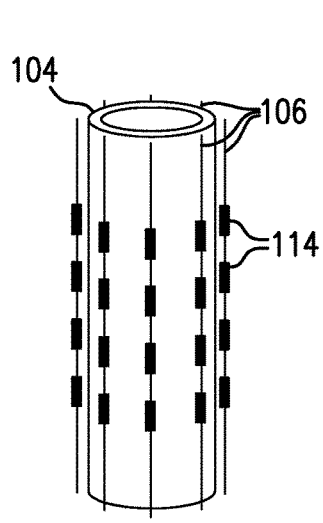
FIGS. 3A-3E show various illustrative sensing array configurations.
Figure 3B:
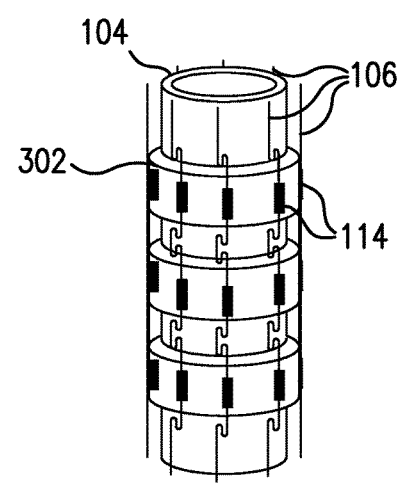
Figure 3C:
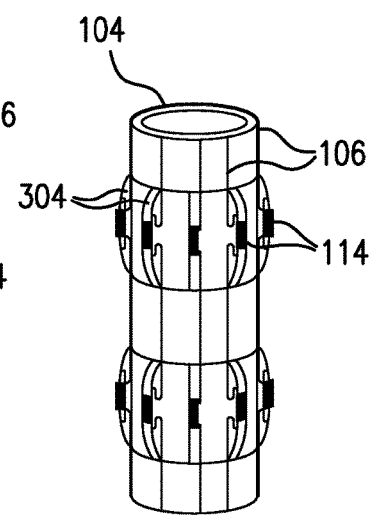

The sensor array may employ multiple fiber optic sending cables 106 as indicated in FIG. 3A. In general, azimuthally sensitive directional resistivity measurements are commonly employed. With cables 106 positioned in parallel or at least in an overlapping axial range, the azimuthal arrangement of sensors 114 enables a multi-dimensional mapping of the electromagnetic fields. Variations in distance between the sensors 114 is arbitrary, and is chosen for specific purpose based on prior analysis including, but not limited to, frequency, depth of investigation, target, transmitter-receiver arrays, etc. In some embodiments, the magnetic induction sensors are mounted to the casing 104 or suspended on fins or spacers to space them away from the body of casing 104. If actual contact with the formation is desired, the magnetic induction sensors 114 may be mounted on swellable packers 302 as indicated in FIG. 3B. Such packers 302 expand when exposed to downhole conditions, pressing the sensors 114 into contact with the borehole wall. FIG. 3C shows the use of bow-spring centralizers 304 which also operate to press the sensors 114 into contact with the borehole walls. To minimize insertion difficulties, a restraining mechanism may hold the spring arms 304 against the casing 104 until the casing has been inserted in the borehole. Thereafter, exposure to downhole conditions or a circulated fluid (e.g., an acid) degrades the restraining mechanism and enables the spring arms to extend the sensors against the borehole wall. If made of conductive material, the spring arms may further serve as current injection electrodes, concentrating the measurable fields in the vicinity of the sensors. To further concentrate the fields, the spring arms outside the zone of interest may be insulated.

Figure 3D:
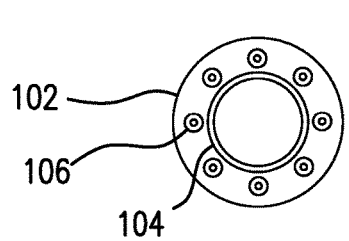
Figure 3E:
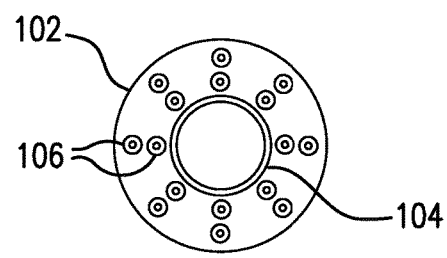

Other extension mechanisms are known in the oilfield and may be suitable for placing the magnetic induction sensors 114 in contact with the borehole wall or into some other desired arrangements such as those illustrated in FIGS. 3D and 3E. In FIG. 3D, the magnetic induction sensors are positioned near the radial midpoint of the annular region. In FIG. 3E, the magnetic induction sensors are placed in a spatial distribution having axial, azimuthal, and radial variation. Balloons, hydraulic arms, and projectiles are other contemplated mechanisms for positioning the magnetic induction sensors.

Figure 4:
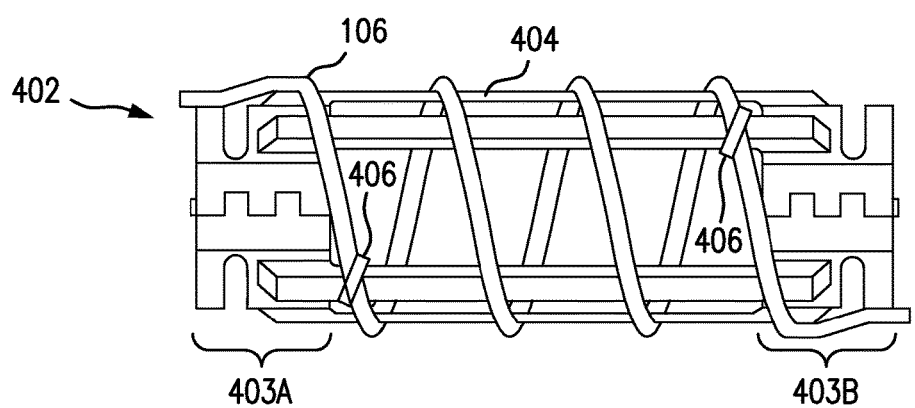
FIG. 4 shows yet another illustrative sensing array configuration.

FIG. 4 shows an illustrative fixed positioning mechanism for magnetic induction sensors 114. The cage 402 includes two clamps 403A, 403B joined by six ribs 404. The fiber optic cable(s) 106 can be run along the ribs or, as shown in FIG. 4, they can be wound helically around the cage. In either case, the ribs provide each fiber optic cable 106 some radial spacing from the casing 104. Cable ties 406 can be used to hold the cable in place until cementing has been completed. The ribs can be made of insulating material to avoid distortion of the electromagnetic fields around the sensors.

Figures 5A, 5B:
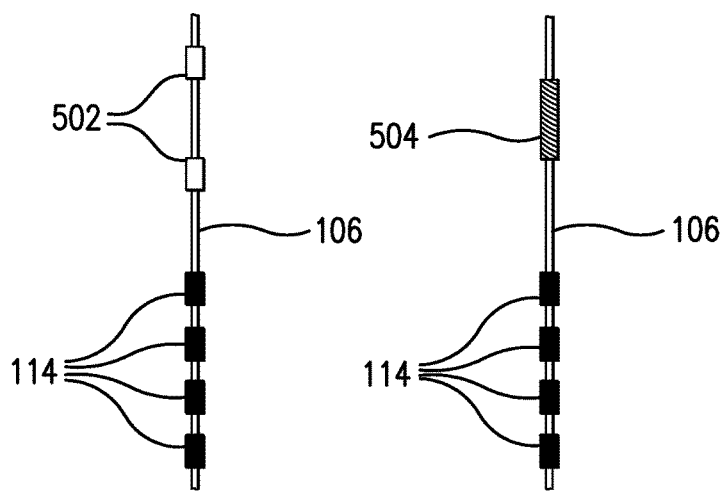
FIGS. 5A-5B show illustrative combined source-sensor cable configurations.

In addition to providing support and communications for magnetic induction sensors 114, the fiber optic cable 106 may support electrodes or antennas for generating electromagnetic fields in the absence of current injection via casing 104. FIG. 5A shows two electrodes 502 on cable 106. A voltage is generated between the two electrodes 502 to create an electric dipole radiation pattern. The response of the magnetic induction sensors 114 can then be used to derive formation parameters.

Similarly, FIG. 5B shows a solenoid antenna 504 on cable 106. A current is supplied to the solenoid coil to create a magnetic dipole radiation pattern. The response of the magnetic induction sensors 114 can then be used to derive formation parameters. In both cases the sensors are shown to one side of the source, but this is not a requirement. The source may be positioned between magnetic induction sensors 114 and/or one or more of the sensors may be positioned between multiple sources. The magnetic induction sensors 114 may even be positioned between the electrodes of an electric dipole source. Moreover, it is possible to tilt the sources and/or the magnetic induction sensors to provide improved directional sensitivity.

It should be noted that conventional magnetic induction sensors typically consist of induction coils (with or without magnetic cores) and their related circuitry to measure the voltage induced in the wire coils $V_i$ by a time-varying magnetic flux density B:

$$V_i = -\frac{\partial B}{\partial t}, \tag{1}$$

One known approach to obtain the B-field response with an induction coil sensor is to time integrate the dB/dt response of equation (1). Another approach to obtain the B-field response involves operating the magnetic induction sensor as a current source, i.e., to measure the short circuit current induced in the induction coil sensor. For a long solenoid (i.e., the solenoid having the length greater than the diameter) with N turns per length L, Ampere's law relates the magnetic induction B to the induced current in the solenoid I expressed by the following equation:

$$B = \mu\left(\frac{N}{L}\right)I, \tag{2}$$

where $\mu$ is the magnetic permeability of the solenoid. If the solenoid has an air core, then $\mu=\mu_e\mu_0$, where $\mu_e$ is the effective magnetic permeability, and is a function of the geometric properties of the core and its relative permeability $\mu_r$. Based on a priori calibration of sensors for determining $\mu$, and from equation (2), current measurements can be related to magnetic induction B, or to the magnetic field H by the following equation:

$$H = \mu_e\left(\frac{N}{L}\right)I, \tag{3}$$

Figure 6:
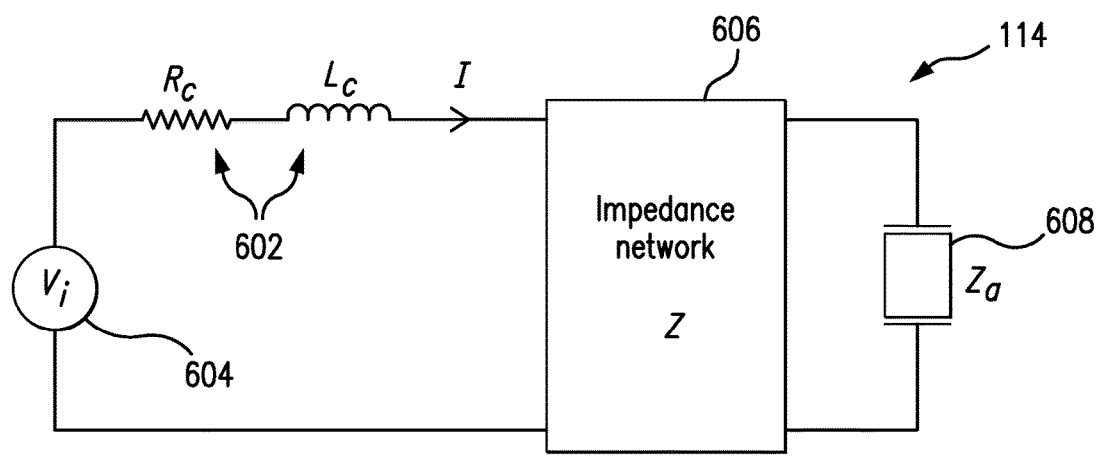
FIG. 6 illustrates a circuit diagram of an exemplary magnetic induction sensor consisting of a coil connected to an electro-optical transducer via an impedance network according to disclosed embodiments.

FIG. 6 illustrates a circuit diagram of an exemplary magnetic induction sensor consisting of an induction coil connected to an electro-optical transducer via an impedance network according to disclosed embodiments. As can be seen, the magnetic induction sensor 114 includes an induction coil 602. The inductance and resistance values of the induction coil 602 are $L_c$ and $R_c$, respectively. A voltage source $V_i$ 604 induces a current I in the induction coil 602. The current signal I induced in the induction coil 602 is sent to impedance network 606. The impedance matching network 602 may include electrically controllable, variable, or tunable components such as capacitors, switches, inductors, and the like, as described herein, and these components may have their component values or operating points tuned to match the low impedance of the coil 602 to the high impedance $Z_a$ of electro-optical transducer 608. The electro-optical transducer 608 is adapted to conduct transversely of the direction of the magnetic field the light supplied to the transducer 608 and to influence it subject to the inductance of the magnetic field. Effectively, impedance network 606 serves as a passive current-to-voltage converter, such that the voltage across the electro-optical transducer 608 ($V_a$) is proportional to the current I in the induction coil 602:

$$V_a = IZ \quad (4)$$

Figure 7:
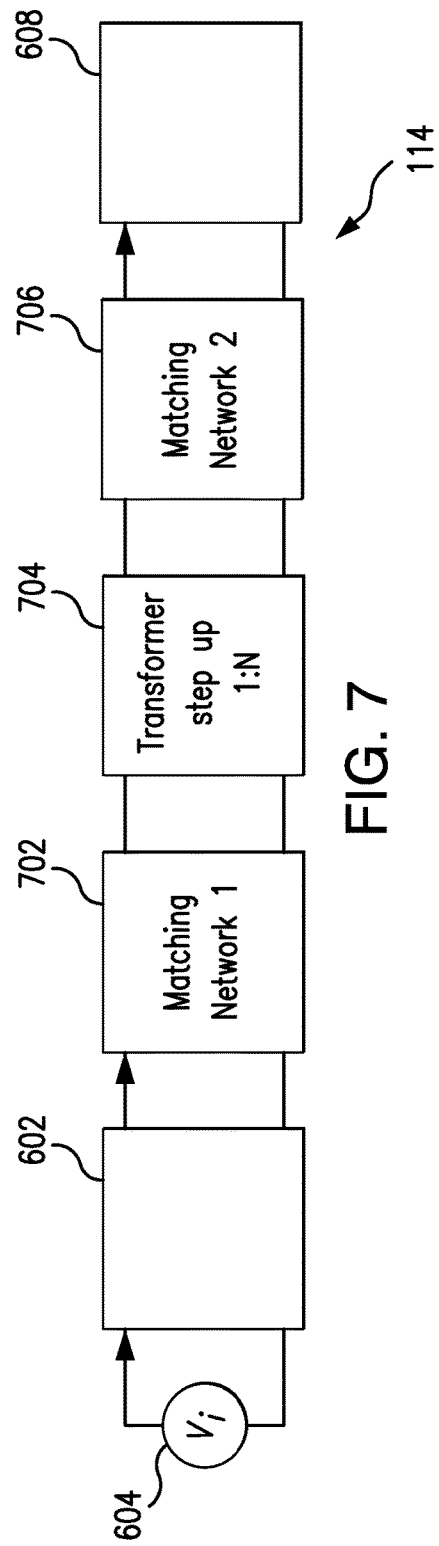
FIG. 7 illustrates another equivalent circuit of an exemplary magnetic induction sensor configured with passive impedance matching circuits according to disclosed embodiments.

FIG. 7 illustrates another equivalent circuit of an exemplary magnetic induction sensor 114 configured with passive impedance matching circuits according to disclosed embodiments. In this embodiment, the impedance matching network 606 (shown in FIG. 6) is implemented using entirely passive components. More specifically, in this embodiment the impedance matching network includes a first impedance matching circuit 702, a second impedance matching circuit 706 and a step-up transformer 704. An input of the first impedance matching circuit 702 is connected with an output of the induction coil 602. An output of the second impedance matching circuit 706 is connected with the input of the electro-optical transducer 608. The step-up transformer 704 connects an output of the first impedance matching circuit 702 with an input of the second impedance matching circuit 706. According to an embodiment of the present invention, the step-up transformer 704 is configured and operable to perform an impedance matching between the first 702 and second 706 impedance matching circuits. As noted above the voltage source $V_i$ 604 induces a current I in the induction coil 602.

According to an embodiment of the present invention, the step-up transformer 704 comprises a passive electrical device that transforms electric energy in the first impedance matching circuit 702 into energy of a similar type in the second impedance matching circuit 706, with altered values of voltage and current to match the electro-optical transducer 608. In various embodiments, the ratio of input voltage to output voltage in the step-up transformer device 704 can be determined by the number of turns in a primary coil as compared to a secondary coil, wherein the primary and secondary coils are components of the step-up transformer 704. There is a small loss associated with this transformation that is made up of two components. The first source of loss is referred to as "core" loss (also called no-load loss). This type of loss results from the magnetizing and de-magnetizing of the core during normal operation of the step-up transformer 704. The second loss component is called coil or load loss, because the efficiency losses occur in the primary and secondary coils of the step-up transformer 704. Coil loss is the result of resistance that exists in the winding materials.

In various embodiments, the step-up transformer 704 can be wound around cores having a variety of shapes ranging from simple cylindrical rods to donut-shaped toroids. Notably, toroids are advantageous in this regard since they substantially contain the magnetic field produced by the step-up transformer 704 within the core region so as to limit RF leakage and avoid coupling and interference with other nearby components.

Figure 8:
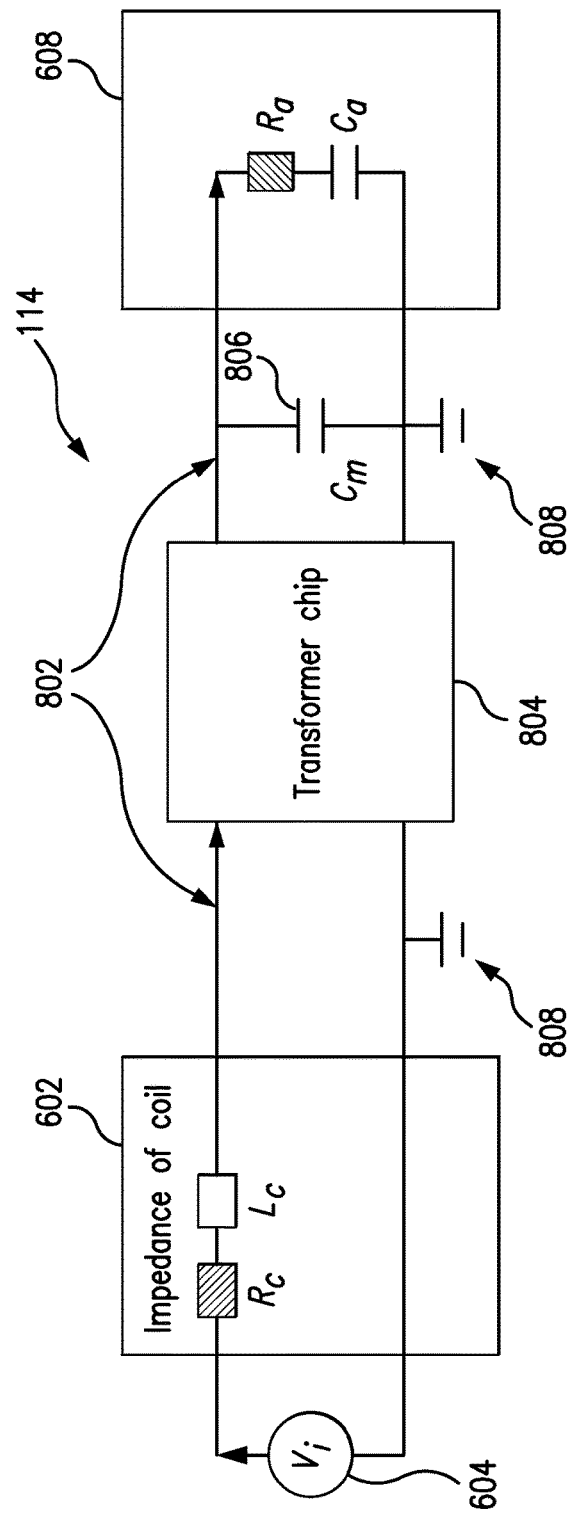
FIG. 8 illustrates yet another circuit diagram of an exemplary magnetic induction sensor that employs capacitive matching circuits according to disclosed embodiments.

FIG. 8 illustrates yet another circuit diagram of an exemplary magnetic induction sensor 114 that employs capacitive matching circuits according to disclosed embodiments. In this embodiment, the induction coil 602 comprises an approximately 100 turn coil with radius of approximately 1 cm wounded as an approximately 10 cm long solenoid around a ferrite core with relative permeability of approximately 250. The inductance $L_c$ of the induction coil 602 is approximately 31 mH and the resistance of the induction coil 602 is approximately 0.025 Ω. Furthermore, the electro-optical transducer 608 comprises a lithium niobate phase modulator having a capacitance ($C_a$) of approximately 20 pF and a resistance ($R_a$) of approximately 1 MΩ. In this embodiment, the impedance matching network 606 (shown in FIG. 6) may also be implemented using entirely passive components. More specifically, such impedance matching network 606 may comprise small discrete passive components, such as a transformer chip 804 having a winding ratio of primary coil to secondary coil greater than 20 and a capacitor chip 806 having a capacitance $C_m$ and capable of matching the impedance of the solenoid (induction coil 602) to the impedance of the electro-optical transducer 608. The capacitor 806 has one terminal connected to ground 808 and has its other terminal connected to a transmission line 802 interconnecting the induction coil 602, transformer chip 804 and electro-optical transducer 608. In some embodiments, the transmission lines 802 could be formed using stranded Printed Circuit Board (PCB) copper trace configuration. Alternatively, short wires soldered to the magnetic induction sensor components could be used.

The disclosed matching network is enabled to produce a resonance with impedance matching to achieve a Q-factor of approximately 200 at a frequency in the range of from approximately 100 Hz to approximately 10 kHz. The voltage source $V_i$ 604 induces a current I in the induction coil 602. As will be readily apparent to those skilled in the art, the minimum voltage necessary to activate the particular electro-optical transducer 608 disclosed in this embodiment (a lithium niobate phase modulator) is approximately 1 µV. Accordingly, the disclosed magnetic induction sensor comprising the components shown in FIG. 8 is adapted and operable to measure a minimum magnetic induction of approximately 5 fT at approximately 1 kHz. Advantageously, such magnetic induction sensor is capable of detecting minimum magnetic fields that are approximately three times lower than the magnetic field measurements that can be performed by conventional magnetic induction sensors known in the art and having the same induction coil 602 and same electro-optical transducer 608 (lithium niobate phase modulator). In general, the structure of magnetic induction sensors disclosed herein is expected to be based on materials having properties with electrostrictive, magnetostrictive, or piezoelectric effect.

At least one fiber optic sensing cable 106 is mechanically coupled to the electrostrictive transducer 608. When a voltage is applied across the electrostrictive, magnetostrictive or piezoelectric material, the deformation (i.e., change in shape) induces a strain on the fiber optic sensing cable 106. According to an embodiment of the present invention, such strain on the fiber optic sensing cable 106 can be remotely interrogated as part of the surface interface 116 using any of the fiber-optic strain measurement methods including, but not limited to, interferometric, fiber Bragg grating (FBG), fiber laser strain (FLS), and extrinsic Fabry-Perot interferometric (EFPI) methods. As a general rule, electrostrictive materials exhibit strains proportional to the square of the applied magnetic field strength (and vice versa), whereas piezoelectric materials exhibit strains that are directly proportional to the applied field strength.

Figure 9:
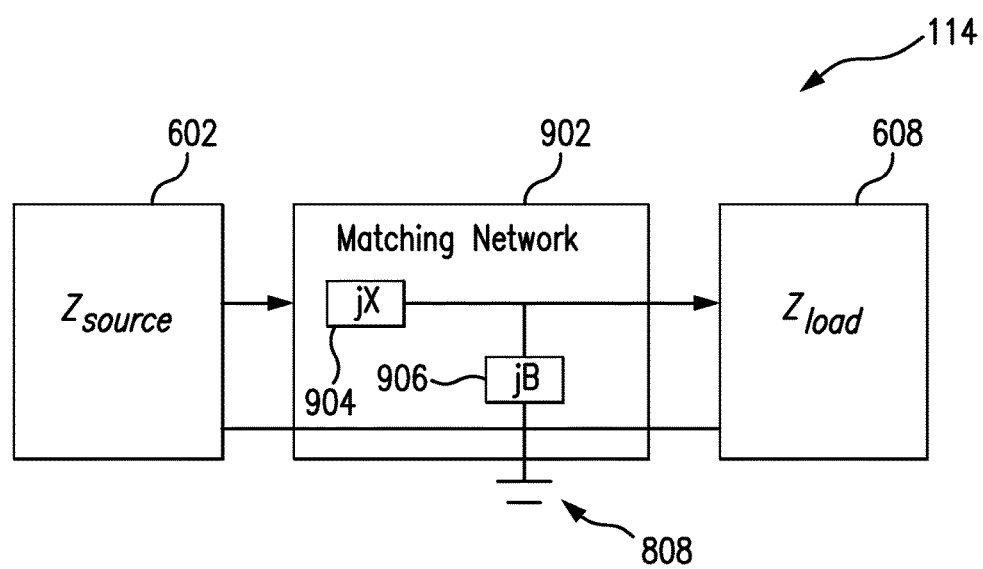
FIG. 9 illustrates yet another equivalent circuit of an exemplary magnetic induction sensor that employs reactive matching circuits and that may be used in a downhole environment.

FIG. 9 is an equivalent circuit of a magnetic induction sensor 114 including an L-section narrow-band impedance matching circuit, in accordance with an embodiment of the present invention. This impedance matching circuit 902 is one embodiment of the impedance matching network 606 that is shown in FIG. 6. The induction coil 602 within the magnetic induction sensor 600 (FIG. 6) may be modeled as an ideal current source, having a source impedance ($Z_{source}$) and the load attached to the electro-optical transducer 608

(FIG. 6) may be modeled as $Z_{load}$. According to this embodiment, the L-section narrow-band impedance matching circuit 902 includes two reactive components, jX 904 and jB 906, which represent series reactance and parallel susceptance, respectively.

Although the equivalent circuit 902 shown in FIG. 9 will provide an impedance match between the source impedance of the induction coil 602 and the load attached to the electro-optical transducer 608, this match is very narrow-band because the optimum values for the inductive and capacitive components selected for jX 904 and jB 906 vary greatly with the frequency of operation.

As set forth above, the embodiments disclosed herein may be implemented in a number of ways. In general, in one aspect, the disclosed embodiments relate to a permanent sensing system. In aspects, the sensing system may be configured for mapping and monitoring deep resistive objects representing hydrocarbon deposits using any combination of electric and/or magnetic (EM) sources (i.e., electric dipole transmitters) deployed on a surface or in single or multiple wells. The system comprises a plurality of magnetic induction sensors 114 that can be placed on a surface (e.g., borehole-to-surface EM tomography) or in single or multiple wells (e.g., croswell EM tomography), as shown in FIGS. 2A-2E. Cross-well EM tomography provides fluid distribution mapping at the interwell scale, and thus can be used for identification of bypassed hydrocarbon, monitoring macroscopic sweep efficiency, planning infill drilling, and improving effectiveness of reservoir simulation.

In some embodiments, the inductance of the induction coil 602 can be increased with a core of preferably soft magnetic material (i.e., but not limited to, ferrite) that is characterized by a high resistivity (e.g., approximately $10^6$ Ωm) and high relative permeability (e.g., above approximately 100).

In general, in another aspect, the disclosed embodiments are intended to be chosen for the specific EM applications (e.g., but not limited to, permanent monitoring, wireline) for specific oilfield applications (e.g., but not limited to, EOR, SAGD, CO2). For example, packaging may be designed specifically to ensure the magnetic induction sensors disclosed herein can reliably operate for the life-of-well under high pressure (e.g., above approximately 35,000 psi) and high temperature (e.g., above approximately 260° C.) acidic or basic subsurface conditions while subject to continuous vibrations for extended periods of time, as are typically encountered in oilfield wells.

At least in some embodiments, the disclosed system can be fabricated and calibrated in such a manner to enable efficient mass production, logistical considerations for transport and ease of deployment as part of a permanent sensing system. For example, a plurality of magnetic induction sensors 114 can be pre-fabricated in a factory and delivered on a cable drum for ease of deployment at the well site by being clamped to the side of casing 104. The packaging of magnetic induction sensors 114 can be shaped to minimize exposure to shear forces and drag resistance against fluid flow, e.g., during cementation. At least some of the sensors 114 may be permanently disposed downhole.

In general, in another aspect, the disclosed embodiments relate to a method for supplying B-field measurements using any type of fiber-optic based sensor systems including, but not limited to, fiber optic-based acoustic, temperature, pressure, strain, chemical, and/or electric field sensors. In some embodiments, at least some of the plurality of magnetic induction sensors 114 are preferably placed at or equidistantly around a common point to improve directional sensitivity to the formation resistivity. In some embodiment, at least some of the plurality of magnetic induction sensors 114 can be placed within a single sensor package. Advantageously, in such arrangement the positioning (e.g., staggered) and orientation (e.g., orthogonal, collinear) of the magnetic inductor sensors 114 preferably allow them to provide a complete range of spatial information about the B-field. Furthermore, such arrangement enables the multiple magnetic induction sensor packages to be highly compact.

Accordingly, as set forth above, the embodiments disclosed herein may be implemented in a number of ways. In general, in one aspect, the disclosed embodiments are directed to a sensing system. The sensing system includes, among other things, a magnetic induction sensor. The magnetic induction sensor includes, among other things, an induction coil for measuring a magnetic induction and for providing an output electrical signal representative of at least one component of the magnetic induction. The magnetic induction sensor additionally includes an electro-optical transducer for converting the electrical signal into an optical signal. The electro-optical transducer includes, among other things, at least two electrodes and at least one optical layer placed between the electrodes. The magnetic induction sensor further includes at least one impedance matching circuit electrically connected with an output of the induction coil and electrically connected with an input of the electrical transducer. The sensing system additionally includes at least one fiber optic sensing cable connected to the magnetic induction sensor that optically communicates optical signals from the magnetic induction sensor.

In one or more embodiments, the magnetic induction sensor may further include any of the following features individually or any two or more of these features in combination: a) the impedance matching circuit that substantially matches impedance associated with the coil to a high impedance of the electro-optical transducer; (b) the impedance matching circuit that includes (i) a first impedance matching circuit having an input connected with the output of the induction coil; (ii) a second impedance matching circuit having an output connected with the input of the electro-optical transducer; and (iii) a step-u transformer having an input connected with an output of the first impedance matching circuit and having an output connected with an input of the second impedance matching circuit, the step-up transformer configured and operable to perform an impedance matching between the first and second impedance matching circuits; (c) the electro-optical transducer is an electrostrictive transducer; (d) the Q-factor is approximately 200 at a frequency in the range of from approximately 100 Hz to approximately 10 kHz; (e) the impedance matching circuit is a transformer having a turn ratio of at least 20 interconnected with a capacitor; (f) the magnetic induction sensor is configured to detect magnetic induction of at least approximately 5 fT at 1 kHz; and (g) the impedance matching circuit has an L topology and comprises a variable-reactance circuit.

In general, in yet another aspect, the disclosed embodiments are related to a method for electromagnetic reservoir monitoring. The method includes, among other steps, the steps of providing a plurality of magnetic induction sensors down a borehole, each of the plurality of magnetic induction sensors is configured to provide an optical signal representative of measurement of at least one component of a magnetic induction and coupling the plurality of magnetic induction sensors with at least one fiber optic sensing cable, the at least one fiber optic cable configured to optically communicate optical signals from the plurality of magnetic induction sensors. The method additionally includes the steps of coupling the at least one fiber optic sensor to a processor via an interface and measuring at least one component of the magnetic induction using the plurality of magnetic induction sensors, the processor configured to analyze the measurements.

In one or more embodiments, the method for electromagnetic reservoir monitoring may further include any one of the following features individually or any two or more of these features in combination: (a) the magnetic induction sensor includes, among other things, an induction coil for measuring a magnetic induction and for providing an output electrical signal representative of at least one component of the magnetic induction and an electro-optical transducer for converting the electrical signal into an optical signal; (b) matching impedance of the induction coil with impedance of the electro-optical transducer using at least one impedance matching circuit electrically connected with an output of the induction coil and electrically connected with an input of the electro-optical transducer; (c) the electro-optical transducer is an electrostrictive transducer; and (d) matching impedance of the induction coil with impedance of the electro-optical transducer includes performing a narrow-band impedance match and the impedance matching circuit includes at least two reactive components.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. An electromagnetic reservoir monitoring system comprising:
    a magnetic induction sensor comprising:
        an induction coil for measuring a magnetic induction and for providing an output electrical signal representative of at least one component of the magnetic induction;
        an electro-optical transducer for converting the electrical signal into an optical signal, the electro-optical transducer comprising at least two electrodes and at least one optical layer placed between the electrodes;
    at least one impedance matching circuit electrically connected with an output of the induction coil and electrically connected with an input of the electro-optical transducer; and
    at least one fiber optic sensing cable connected to the magnetic induction sensor that optically communicates optical signals from the magnetic induction sensor;
    wherein the at least one impedance matching circuit comprises:
    a first impedance matching circuit having an input connected with the output of the induction coil;
    a second impedance matching circuit having an output connected with the input of the electro-optical transducer; and
    a step-up transformer having an input connected with an output of the first impedance matching circuit and having an output connected with an input of the second impedance matching circuit, the step-up transformer configured and operable to perform an impedance matching between the first and second impedance matching circuits.

2. The system of claim 1, wherein the at least one impedance matching circuit substantially matches impedance associated with the coil to a high impedance of the electro-optical transducer.

3. The system of claim 2, wherein the electro-optical transducer comprises an electrostrictive transducer.

4. The system of claim 3, wherein the Q-factor is approximately 200 at a frequency in the range of from approximately 100 Hz to approximately 10 kHz.

5. The system of claim 3, wherein the at least one fiber optic sensing cable is mechanically coupled to the electrostrictive transducer.

6. The system of claim 1, wherein the at least one impedance matching circuit comprises a transformer having a turn ratio of at least 20 interconnected with a capacitor.

7. The system of claim 1, wherein the magnetic induction sensor is configured to detect magnetic induction of at least approximately 5 fT at 1 kHz.

8. The system of claim 1, wherein the at least one impedance matching circuit has an L topology and wherein the at least one impedance matching circuit comprises a variable-reactance circuit.

9. The system of claim 1, further comprising a plurality of electrical transmission lines interconnecting the coil, at least one impedance matching circuit and electro-optical transducer.

10. The system of claim 1, further comprising an optical data interrogation device communicatively coupled to one end of the at least one fiber optic sensing cable and configured to convert optical signals representing data measurements provided by the magnetic induction sensor to corresponding physical signals.

11. A method for electromagnetic reservoir monitoring, the method comprising:
    providing a plurality of magnetic induction sensors down a borehole, each of the plurality of magnetic induction sensors is configured to provide an optical signal representative of measurement of at least one component of a magnetic induction;
    coupling the plurality of magnetic induction sensors with at least one fiber optic sensing cable, the at least one fiber optic sensing cable configured to optically communicate optical signals from the plurality of magnetic induction sensors;
    coupling the at least one fiber optic sensor to a processor via an interface; and
    measuring at least one component of the magnetic induction using the plurality of magnetic induction sensors,
    wherein the processor is configured to analyze the measurements obtained by the plurality of magnetic inductions sensors; and
    wherein each of the plurality of magnetic induction sensors comprises an induction coil for measuring the magnetic induction and for providing an output electrical signal representative of the at least one component of the magnetic induction, and an electro-optical transducer for converting the electrical signal into the optical signal, the electro-optical transducer comprising at least two electrodes and at least one optical layer placed between the electrodes;
    the method further comprising matching impedance of the induction coil with impedance of the electro-optical transducer using at least one impedance matching circuit electrically connected with an output of the induction coil and electrically connected with an input of the electro-optical transducer;

wherein the at least one impedance matching circuit comprises a first impedance matching circuit having an input connected with the output of the induction coil, a second impedance matching circuit having an output connected with the input of the electro-optical transducer, and a step-up transformer having an input connected with an output of the first impedance matching circuit and having an output connected with an input of the second impedance matching circuit, wherein the step-up transformer is configured and operable to perform an impedance matching between the first and second impedance matching circuits.

12. The method of claim 11, wherein the electro-optical transducer comprises an electrostrictive transducer.

13. The method of claim 11, wherein matching impedance of the induction coil with impedance of the electro-optical transducer comprises performing a narrow-band impedance match and wherein the at least one impedance matching circuit comprises at least two reactive components.

14. An apparatus for electromagnetic reservoir monitoring, the apparatus comprising:
an induction coil for measuring a magnetic induction and for providing an output electrical signal representative of at least one component of the magnetic induction;
an electro-optical transducer for converting the electrical signal into an optical signal, the electro-optical transducer comprising at least two electrodes and at least one optical layer placed between the electrodes; and
at least one impedance matching circuit electrically connected with an output of the induction coil and electrically connected with an input of the electro-optical transducer, the at least one impedance matching circuit comprising:
a first impedance matching circuit having an input connected with the output of the induction coil;
a second impedance matching circuit having an output connected with the input of the electro-optical transducer; and
a step-up transformer having an input connected with an output of the first impedance matching circuit and having an output connected with an input of the second impedance matching circuit, wherein the step-up transformer is configured and operable to perform an impedance matching between the first and second impedance matching circuits.

15. The apparatus of claim 14, wherein the at least one impedance matching circuit comprises a transformer having a turn ratio of at least 20 interconnected with a capacitor.

* * * * *